United States Patent
Barman et al.

(10) Patent No.: US 10,623,222 B2
(45) Date of Patent: Apr. 14, 2020

(54) VECTORIZED PEAK DETECTION FOR SIGNAL PROCESSING

(71) Applicant: Xilinx, Inc., San Jose, CA (US)

(72) Inventors: Kaushik Barman, Hyderbad (IN); Parag Dighe, Hyderabad (IN); Baris Ozgul, Dublin (IE); Sneha Bhalchandra Date, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/117,605

(22) Filed: Aug. 30, 2018

(65) Prior Publication Data

US 2020/0076660 A1    Mar. 5, 2020

(51) Int. Cl.
*H04L 27/26* (2006.01)
*G01R 19/25* (2006.01)
*G01R 19/04* (2006.01)

(52) U.S. Cl.
CPC .......... *H04L 27/2614* (2013.01); *G01R 19/04* (2013.01); *G01R 19/2509* (2013.01)

(58) Field of Classification Search
CPC . G01R 19/04; G01R 19/2509; G01R 19/2506
See application file for complete search history.

(56) References Cited

U.S. PATENT DOCUMENTS

| | | | |
|---|---|---|---|
| 6,956,905 B1 | 10/2005 | Rokhsaz | |
| 8,837,558 B1 * | 9/2014 | Rao | G01S 5/0215 375/152 |
| 8,838,056 B2 | 9/2014 | Fanaswalla | |
| 9,014,319 B1 | 4/2015 | Copeland | |
| 9,054,928 B1 | 6/2015 | Copeland | |
| 9,160,594 B1 | 10/2015 | Copeland | |
| 9,313,078 B1 | 4/2016 | Barman | |
| 9,804,207 B1 | 10/2017 | Lesea | |
| 2014/0044215 A1 * | 2/2014 | Mundarath | H04L 27/2624 375/297 |
| 2017/0026216 A1 * | 1/2017 | Zhao | H04L 27/2623 |
| 2019/0113486 A1 * | 4/2019 | Kanazawa | G01N 30/8631 |

* cited by examiner

*Primary Examiner* — David B Lugo
(74) *Attorney, Agent, or Firm* — Patterson + Sheridan, LLP

(57) ABSTRACT

Techniques related to a data processing engine for an integrated circuit (IC) are described. In an example, a method is provided for vectorized peak detection. The method includes dividing a set of data samples of a data signal, corresponding to a peak detection window (PDW), into a plurality of subsets of data samples each comprising a number of data samples. The method includes performing vector operations on each of the plurality of subsets of data samples. The method includes determining a running index of a sample with a maximum amplitude over the PDW based on the vector operations.

18 Claims, 10 Drawing Sheets

VECTORIZED PEAK DETECTION FOR SIGNAL PROCESSING

TECHNICAL FIELD

Examples of the present disclosure generally relate to electronic circuits and, in particular, to data processing for using vectorized peak detection.

BACKGROUND

A processor, a system on a chip (SoC), and an application specific integrated circuit (ASIC) can include multiple cores for performing compute operations such as processing digital signals, performing cryptography, executing software applications, rendering graphics, and the like. Multiple cores can be implemented as vector processors using the principle of single instruction multiple data (SIMD). In SIMD, multiple processors perform an operation simultaneously on multiple data points (e.g., as a set of data samples, also referred to as elements). Thus, SIMD exploits data level parallelism for multiple simultaneous computations for a single process or instruction.

One example of a process that can be performed by multiple cores using SIMD is peak detection. Peak detection is the problem of finding local maxima points on a set of data samples (also referred to as elements). Samples can be compared by comparing the magnitude or the squared magnitude (e.g., the power) of the sample with the magnitude or power of nearby samples by scanning through the data. Thus, for a stream of incoming data x, the point $x_n$ is defined as a local maximum if it satisfies the following:

$$|Xn-1|<|Xn|>|Xn+1|$$

Peak detection can be used for signal processing functions such as peak cancellation based crest factor reduction (PC-CFR). In PC-CFR, detected peaks are qualified to check whether they exceed a preset threshold. The qualification chooses the highest peaks over a predefined block of data called the peak detect window (PDW). The qualified peaks are scaled, filtered, and then subtracted from the original data stream. Thus, with PC-CFR using peak detection the resultant signal shows a lower peak-to-average ratio.

Peak detection involves the same operation to be performed on the set of data samples. The peak detection involves element-wise comparison and index finding, which makes it difficult for implementation on a vector processor. For example, peak detection typically involves breaking the vector pipeline or resorting to a scalar operation over a large set of data. This results in additional compute cycles and slows the process.

Thus, improved techniques for peak detection, for example for PC-CFR, would be useful.

SUMMARY

Techniques related to a data processing engine (DPE) for an integrated circuit (IC) are described. In an example, a method is provided for vectorized peak detection. The method includes providing a set of data samples of a data signal, corresponding to a peak detection window (PDW), into a plurality of subsets of data samples each comprising a number of data samples. The method includes performing vector operations on each of the plurality of subsets of data samples. The method includes determining a running index of a sample with a maximum amplitude over the PDW based on the vector operations.

In another example, a DPE is provided. The DPE includes a register file and a processor, coupled to the register file. The processor is configured to divide a set of data samples of a data signal, corresponding to a PDW, into a plurality of subsets of data samples each comprising a number of data samples. The processor is configured to perform vector operations on each of the plurality of subsets of data samples. The processor is configured to determine a running index of a sample with a maximum amplitude over the PDW based on the vector operations.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
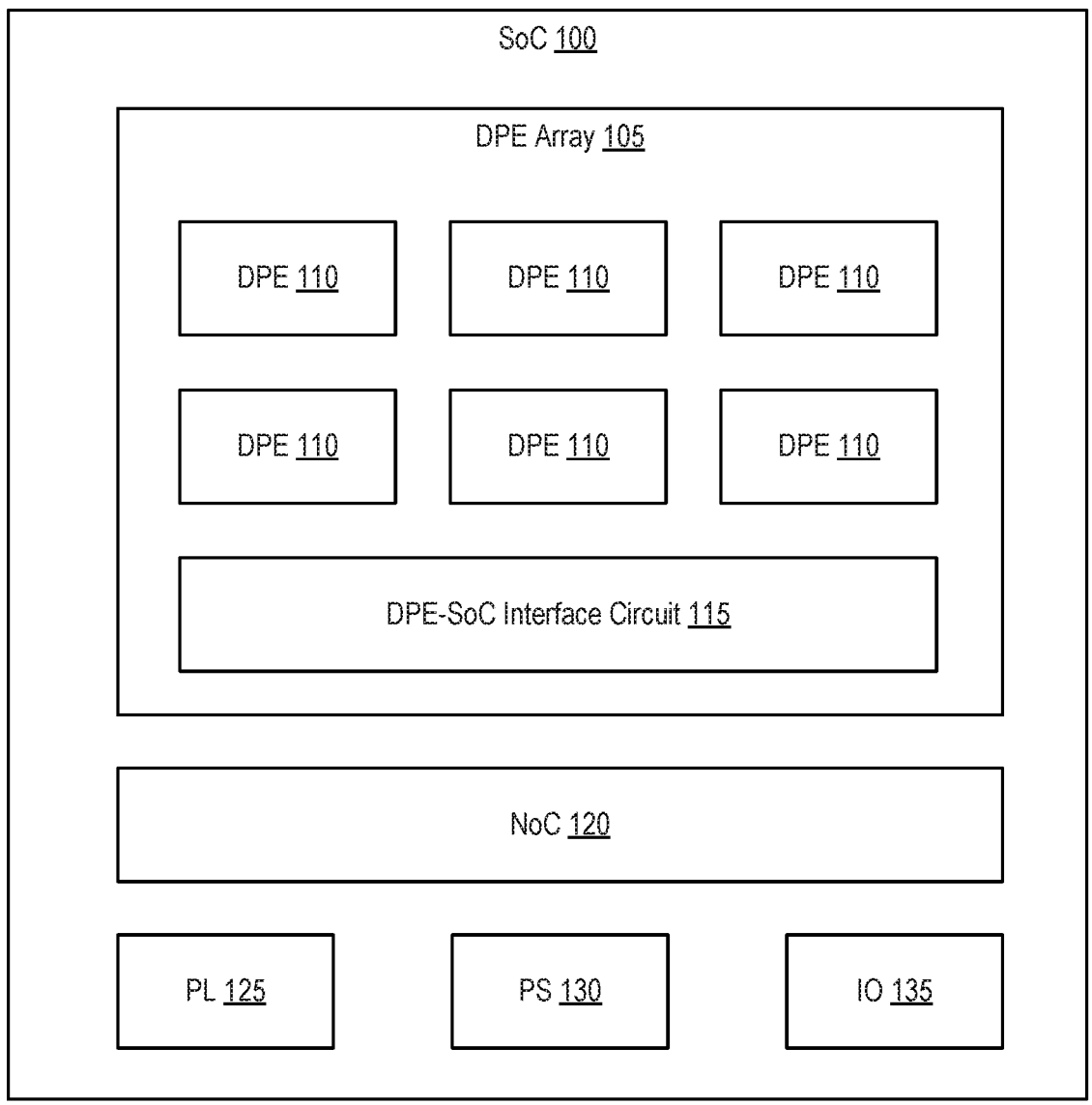
FIG. 1 is a block diagram of a System-on-Chip (SoC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Examples of the disclosure relate to techniques and apparatus for vectorized peak detection. In some examples, peak detection is performed over a large number of data samples by dividing the samples into smaller blocks for processing. These smaller blocks of data can be vectorized and, thus, easy to implement on a vector processor, such as a SIMD processor for element-wise or lane-wise vector-max operation. Some examples provide index tracking for a peak in a vectorized manner during processing of the smaller block of data. Some examples provide vector instructions for the max finding and index tracking implement on a processor, such as an SIMD type processor, that can be performed iteratively for peak detection and peak index finding over the large data set.

FIG. 1 is a block diagram of an example System-on-Chip (SoC) 100 that includes a data processing engine (DPE) array 105 as an example of a processor that can perform examples of the disclosure for vectorized peak detection. The DPE array 105 includes a plurality of data processing engines (DPEs) 110 that may be arranged in a grid, cluster, or checkerboard pattern in the SoC 100. Although FIG. 1 illustrates arranging the DPEs 110 in a 2D array with rows and columns, the examples are not limited to this arrangement. Further, the DPE array 105 can be any size and have any number of rows and columns formed by the DPEs 110.

In one example, the DPEs 110 are identical. That is, each of the DPEs 110 (also referred to as tiles or blocks) may have the same hardware components or circuitry. Further, the examples herein are not limited to DPEs 110. Instead, the SoC 100 can include an array of any kind of processing elements or data processing engines. Moreover, the DPEs 110 could be cryptographic engines or other specialized hardware for performing one or more specialized tasks. As such, the DPEs 110 can be referred to generally as data processing engines.

In FIG. 1, the DPE array 105 includes DPEs 110 that are all the same type (e.g., a homogeneous array). However, in another example, the DPE array 105 may include different types of engines. For example, the DPE array 105 may include DPEs 110, cryptographic engines, forward error correction (FEC) engines, and the like. Regardless if the DPE array 105 is homogenous or heterogeneous, the DPEs 110 can include connections to memory modules in neighboring DPEs 110 which permit the DPEs 110 to share the memory modules as described in more detail below.

In one example, the DPEs 110 are formed from non-programmable logic—i.e., are hardened. One advantage of doing so is that the DPEs 110 may take up less space in the SoC 100 relative to using programmable logic to form the hardware elements in the DPEs 110. That is, using hardened or non-programmable logic circuitry to form the hardware elements in the DPEs 110 such as program memories, an instruction fetch/decode unit, fixed-point vector units, floating-point vector units, arithmetic logic units (ALUs), multiply accumulators (MAC), and the like can significantly reduce the footprint of the DPE array 105 in the SoC 100. Although the DPEs 110 may be hardened, this does not mean the DPEs 110 are not programmable. That is, the DPEs 110 can be configured when the SoC 100 is powered on or rebooted to perform different functions or tasks.

The DPE array 105 also includes a DPE-SoC interface circuit 115 that serves as a communication interface between the DPEs 110 and other hardware components in the SoC 100. In this example, the SoC 100 includes a network on chip (NoC) 120 that is communicatively coupled to the DPE-SoC interface circuit 115. Although not shown, the NoC 120 may extend throughout the SoC 100 to permit the various components in the SoC 100 to communicate with each other. For example, in a physical implementation, the DPE array 105 may be disposed in an upper right portion of the integrated circuit forming the SoC 100. However, using the NoC 120, the DPE array 105 can nonetheless communicate with, for example, programmable logic (PL) 125, a processor subsystem (PS) 130 or input/output (I/O) 135 which may disposed at different locations throughout the SoC 100.

In addition to providing an interface between the DPEs 110 and the NoC 120, the DPE-SoC interface circuit 115 may also provide a connection directly to a communication fabric in the PL 125. In one example, the DPE-SoC interface circuit 115 includes separate hardware components for communicatively coupling the DPEs 110 to the NoC 120 and to the PL 125 that is disposed near the DPE array 105 in the SoC 100.

Although FIG. 1 illustrates one block of PL 125, the SoC 100 may include multiple blocks of PL 125 (also referred to as configuration logic blocks) that can be disposed at different locations in the SoC 100. For example, the SoC 100 may include hardware elements that form a field programmable gate array (FPGA). However, in other examples, the SoC 100 may not include any PL 125—e.g., the SoC 100 is an ASIC.

Figure 2:
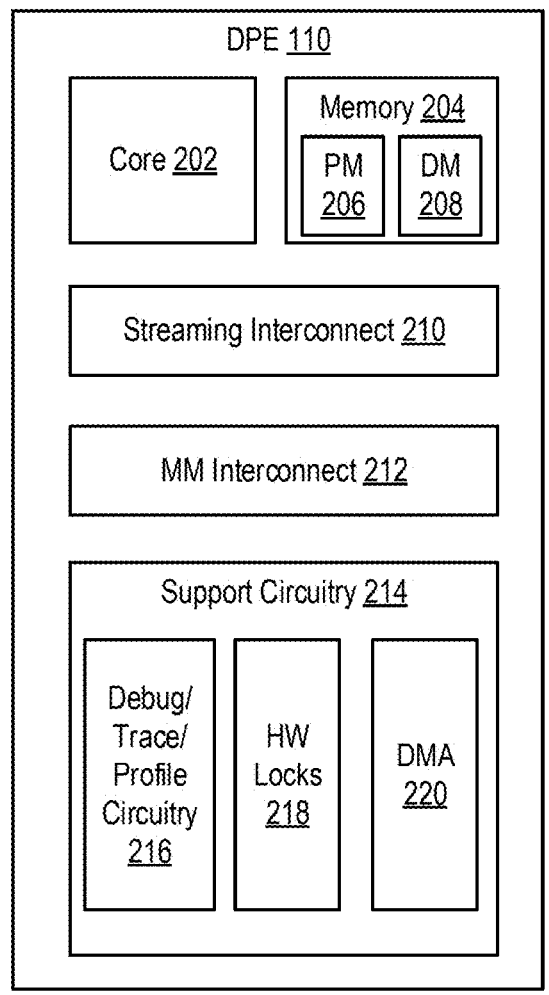
FIG. 2 is a block diagram depicting a tile circuit according to an example.

FIG. 2 is a block diagram depicting a tile circuit 200 according to an example. The tile circuit 200 can be used as a DPE 110 discussed above and shown in FIG. 1. The tile circuit 200 includes a core 202 (i.e., a data processing engine), a memory 204, a streaming interconnect 210, memory-mapped (MM) interconnect 212, and support circuitry 214. In some examples, the support circuitry 214 includes debug circuitry 216, hardware (HW) synchronization circuitry ("HW locks 218"), and direct memory access (DMA) circuitry ("DMA 220"). The memory 204 includes program memory ("PM 206") and data memory ("DM 208").

The core 202 includes one or more compute units for processing data according to instruction(s) stored in the PM 206. In an example, the core 202 includes a very-long instruction word (VLIW) processor, a single instruction, multiple data (SIMD) or vector processor, or a VLIW SIMD/vector processor. In an example, the PM 206 is private to the core 202 (e.g., the PM 206 stores instruction(s) only for use by the core 202 in the tile circuit 200). In an example, the PM 206 comprises a single-ported random access memory (RAM). The PM 206 can be coupled to the MM interconnect 212 for configuration and loading of instructions.

The core 202 can be directly coupled to the streaming interconnect 210 to receive input stream(s) and/or provide output stream(s). In addition, the core 202 can read and write data to the DM 208 in the tile circuit 200. As discussed further below, the core 202 in the tile circuit 200 can also access the DM in one or more neighboring tile circuits (e.g., north, south, east, and west neighboring tile circuits). In an example, the core 202 can also include a direct connection with the data processing engine in one or more neighboring tiles for forwarding accumulator output (e.g., input and output cascading connection(s)). In an example, the core 202 sees the DM 208 in the tile circuit 200 and other DM(s) in neighboring tile(s) as one contiguous block of memory. The DPE 110 can also include an interface to the HW locks 218 and an interface to the debug circuitry 216. The debug circuitry 216 can include trace, debug, and/or profile circuitry.

The MM interconnect 212 can be an AXI memory-mapped interconnect or the like configured for transmission of data using address transactions between components. In an example, the MM interconnect 212 is used for configuration, control, and debugging functionality for the tile circuit 200. The MM interconnect 212 includes one or more switches that route transactions based on address. Circuitry can use the MM interconnect 212 to access the memory 204, the core 202, the DMA 220, and configuration registers in the tile circuit 200.

The streaming interconnect 210 can be an Advanced eXtensible Interconnect (AXI) streaming interconnect or the like configured for transmission of streaming data between components. The streaming interconnect 210 is used for transferring data between the tile circuit 200 and external circuits. The streaming interconnect 210 can support both circuit switching and packet switching mechanisms for both data and control.

In an example, the DM 208 can include one or more memory banks (e.g., random access memory (RAM) banks). The DMA 220 is coupled between the streaming interconnect 210 and the DM 208. The DMA 220 is configured to move data from the streaming interconnect 210 to the DM 208 and move data from the DM 208 to the streaming interconnect 210. In this manner, an external circuit (e.g., a circuit configured in programmable logic or a circuit in an embedded processing system of the IC) can read data from and write data to the DM 208 through the streaming interconnect 210 using DMA. The DMA 220 can be controlled through the MM interconnect 212 and/or the streaming interconnect 210.

The HW locks 218 could be used to lock particular memory banks of the DM 208 for access by the core 202, another data processing engine in another tile, or the DMA 220. The HW locks 218 provide synchronization between neighboring data processing engines in neighboring tiles, between the core 202 and the DMA 220, and between the DPE 110 and an external circuit (e.g., an external processor). The HW locks 218 can also be used to lock a particular buffer in the DM 208, which may be stored in one or more memory banks or in a portion of a single memory bank. The debug circuitry 216 is configured to provide debug, trace, and profile functions. The debug circuitry 216 can trace events generated by circuits in the tile circuit 200. The debug circuitry 216 can provide profile functionality, for example, configurable performance counters.

Figure 3:
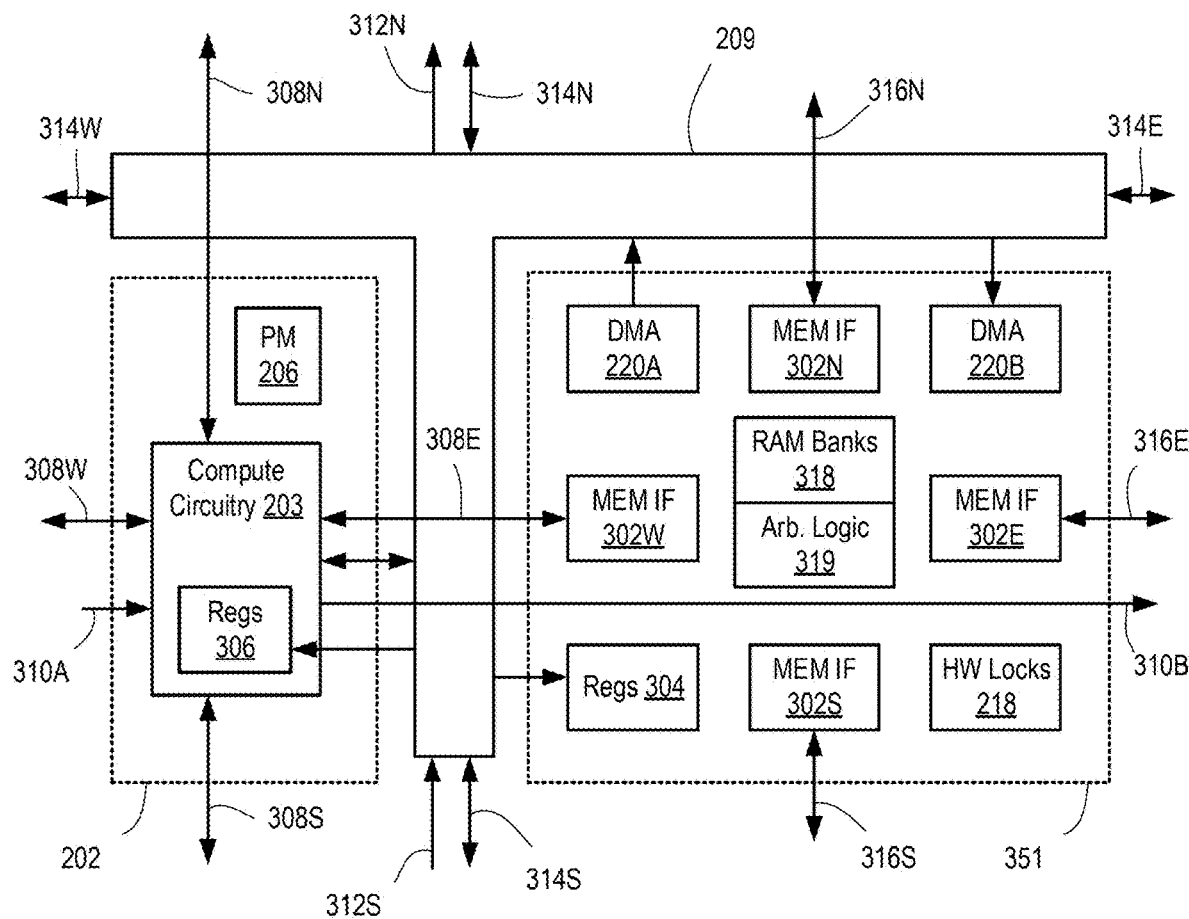
FIG. 3 is a block diagram depicting the tile circuit of FIG. 2 in more detail according to an example.

FIG. 3 is a block diagram depicting the tile circuit 200 in more detail according to an example. In the example, the tile circuit 200 includes data processing circuitry 350, memory circuitry 351, and interconnect circuitry 320. The data processing circuitry 350 includes the core 202 and the PM 206. The memory circuitry 351 includes memory interfaces 302N, 302S, 302E, and 302 W (collectively memory interfaces or individually "mem IF"), RAM banks 318, the HW locks 218, registers ("regs 304"), a DMA interface 204A, and a DMA interface 220B. The core 202 includes registers ("regs 306"). The interconnect circuitry 320 includes the MM interconnect 212 and the streaming interconnect 210 (not explicitly shown). The RAM banks 318 include arbitration logic 319 per bank. The arbitration logic 319 is configured to control which interface (N, S, E, W, DMA, external PS, etc.) has access to which bank.

The interconnect circuitry 320 includes a streaming connection 314 W to a west tile, a streaming connection 314E to an east tile, a streaming connection 314N to a north tile, and a streaming connection 314S to a south tile. Each streaming connection 314 includes one or more independent streaming interfaces (e.g., busses), each having a specific bit width. The interconnect circuitry 320 also includes a memory-mapped connection 312S from a south tile and a memory-mapped connection 312N to a north tile. Although only north and south MM connections are shown, it is to be understood that the interconnect circuitry 320 can include other configurations for the MM interconnect (e.g., east-to-west, west-to-east, north-to-south, and the like). It is to be understood that the interconnect circuitry 320 can include other arrangements of streaming and memory-mapped connections than shown in the example of FIG. 3. In general, the interconnect circuitry 320 includes at least one streaming connection 314 and at least one memory-mapped connection 312.

The core 202 includes a connection 308 W to memory circuitry in a west tile, a connection 308S to memory circuitry in a south tile, a connection 308N to memory circuitry in a north tile, and a connection 308E to the memory circuitry 351. The core 202 includes a streamlining interface to the interconnection circuitry 320. The core 202 also includes a connection 310A from a processing engine in the west tile and a connection 310B to a processing engine in the east tile (e.g., cascading connections). It is to be understood that the data processing engine can include other arrangements of memory and cascading connections than shown in the example of FIG. 3. In general, the core 202 includes at least one memory connection and can include at least one cascading connection.

The mem IF 302 W is coupled to the memory connection 308E of the core 202. The mem IF 302N is coupled to a memory connection of the data processing engine in the north tile. The mem IF 302F is coupled to a memory connection of the data processing engine in the east tile. The mem IF 302S is coupled to a memory connection of the data processing engine in the south tile. The mem IF 302 W, 302N, 302E, and 302S are coupled to the RAM banks 318. The DMA 220A includes an output coupled to the interconnect circuitry 320 for handling memory to interconnect streams. The DMA interface 220B includes an input coupled to the interconnect circuitry 320 for handling interconnect to memory streams. The regs 304 and the regs 306 are coupled to the interconnect circuitry 320 to receive configuration data therefrom (e.g., using the memory-mapped interconnect).

Figure 4:
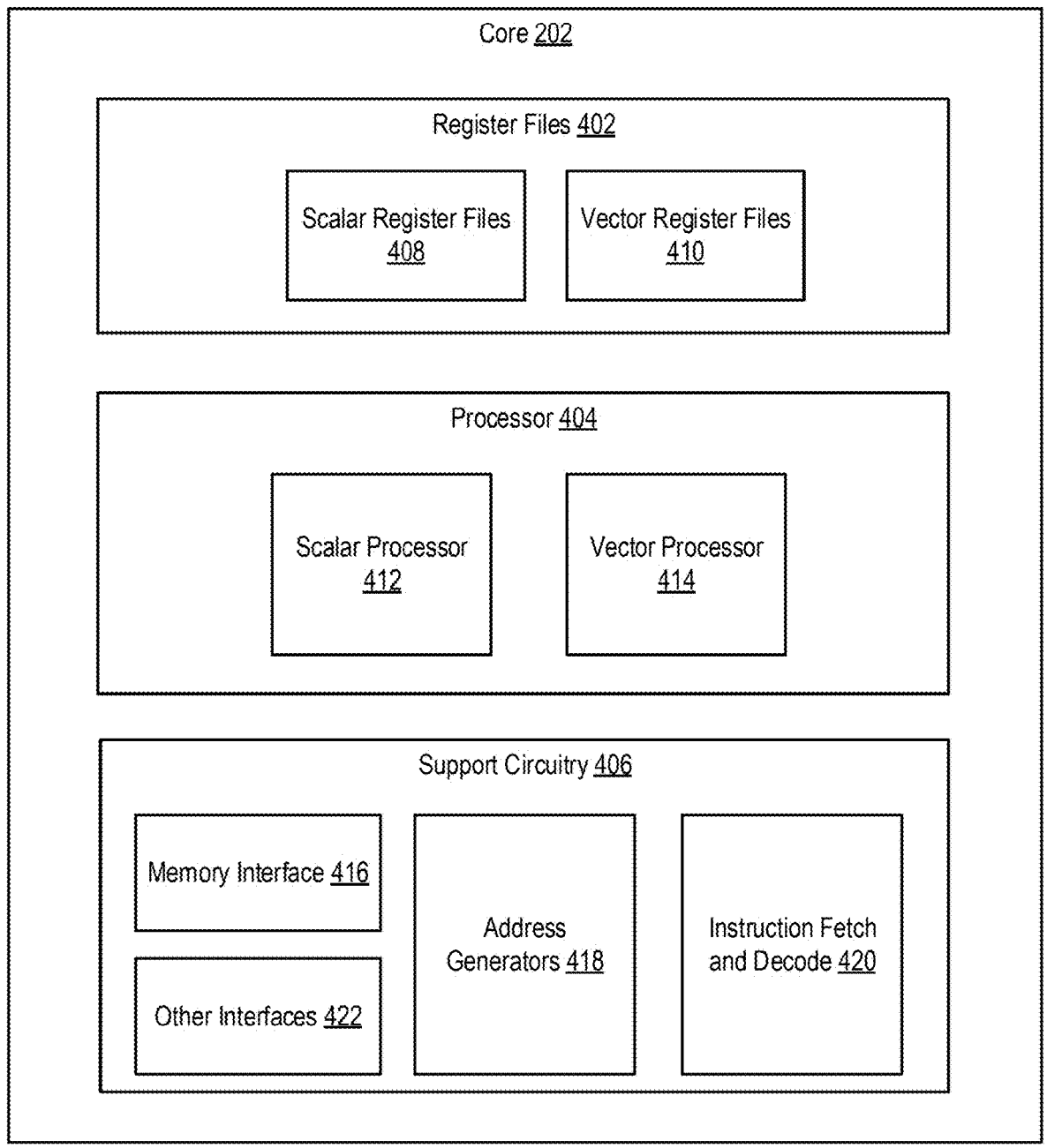
FIG. 4 is a block diagram depicting tile interconnect circuitry according to an example.

FIG. 4 is a block diagram depicting the core 202 according to an example. The core 202 includes register files 402, a processor 404, and support circuitry 406. The register files 402 include scalar register files 408 and vector register files 410. The scalar register files 408 include general purpose registers, pointer registers, modifier registers, configuration registers, and the like. The vector register files 410 include high-width registers (as compared to the scalar registers) that support SIMD instructions for a vector data path. The vector register files 410 can include vector registers, accumulator registers, and the like. The register files 402 can include other types of registers, such as a program counter, stack pointer, link register, various configuration, control and status registers, and the like.

The processor 404 includes a scalar processor 412 and a vector processor 414. The scalar processor 412 is configured to perform scalar arithmetic, including signed and unsigned multiplication, add/subtract, shifts, compares, and logical operations, elementary functions, such as square-root, sine/cosine, and the like. The vector processor 414 is configured to perform vector arithmetic, including permute functions, pre-addition functions, multiplication functions, post-addition functions, accumulation functions, shift, round and saturate functions, upshift functions, and the like. The vector processor 414 supports multiple precisions for complex and real operands. The vector processor 414 can include both fixed-point and floating-point data paths.

The support circuitry 406 includes a memory interface 416, address generators 418, instruction fetch and decode circuitry 420, and one or more additional interfaces 422. The instruction fetch and decode circuitry 420 is configured to fetch instructions from the PM 206, decode the fetched instructions, and provide control signals to the processor 404 to control operation thereof according the decoded instructions. The address generators 418 are configured to generate addresses for data memory to load data from or store data to the data memory. The memory interface 416 is configured to communicate with data memory to send data to and receive data from according to the decoded instructions and the addresses generated by the address generators 418. The other interfaces 422 can include an interface to the HW locks 218, an interface to the streaming interconnect 210, an interface to receive cascade stream(s) from other data processing engines, an interface to the debug circuitry 216, and the like.

Figure 5:
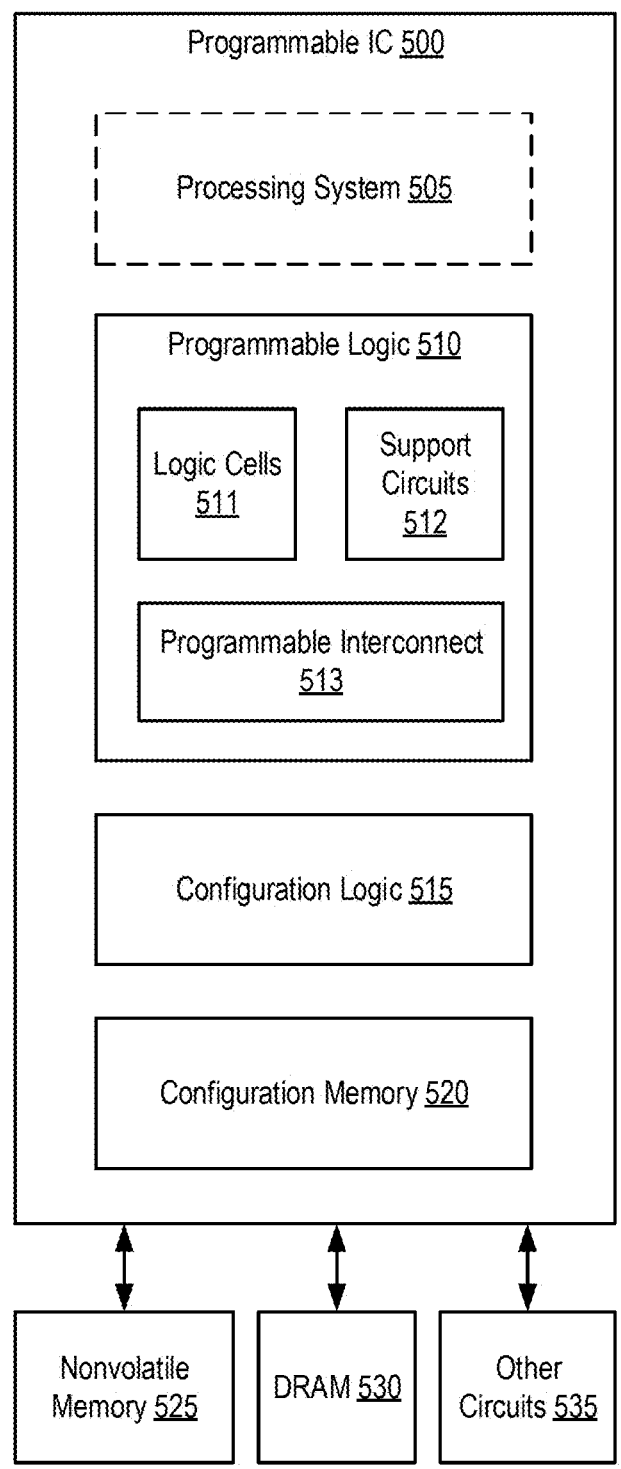
FIG. 5 is a block diagram depicting a programmable IC according to an example that can be used as an implementation of the SoC shown in FIG. 1.

FIG. 5 is a block diagram depicting a programmable IC 500 according to an example that can be used as an implementation of the SoC 100 shown in FIG. 1. The programmable IC 500 includes programmable logic 510, configuration logic 515, and configuration memory 520. The programmable IC 500 can be coupled to external circuits, such as nonvolatile memory 525, DRAM 530, and other circuits 535. The programmable logic 510 includes logic cells 511, support circuits 512, and programmable interconnect 513. The logic cells 511 include circuits that can be configured to implement general logic functions of a plurality of inputs. The support circuits 512 include dedicated circuits, such as transceivers, input/output blocks, digital signal processors, memories, and the like. The logic cells 511 and the support circuits 512 can be interconnected using the programmable interconnect 513. Information for programming the logic cells 511, for setting parameters of the support circuits 512, and for programming the programmable interconnect 513 is stored in the configuration memory 520 by the configuration logic 515. The configuration logic 515 can obtain the configuration data from the nonvolatile memory 525 or any other source (e.g., the DRAM 530 or from the other circuits 29). In some examples, the programmable IC 500 includes a processing system 505. The processing system 505 can include microprocessor(s), memory, support circuits, IO circuits, and the like.

Figure 6:
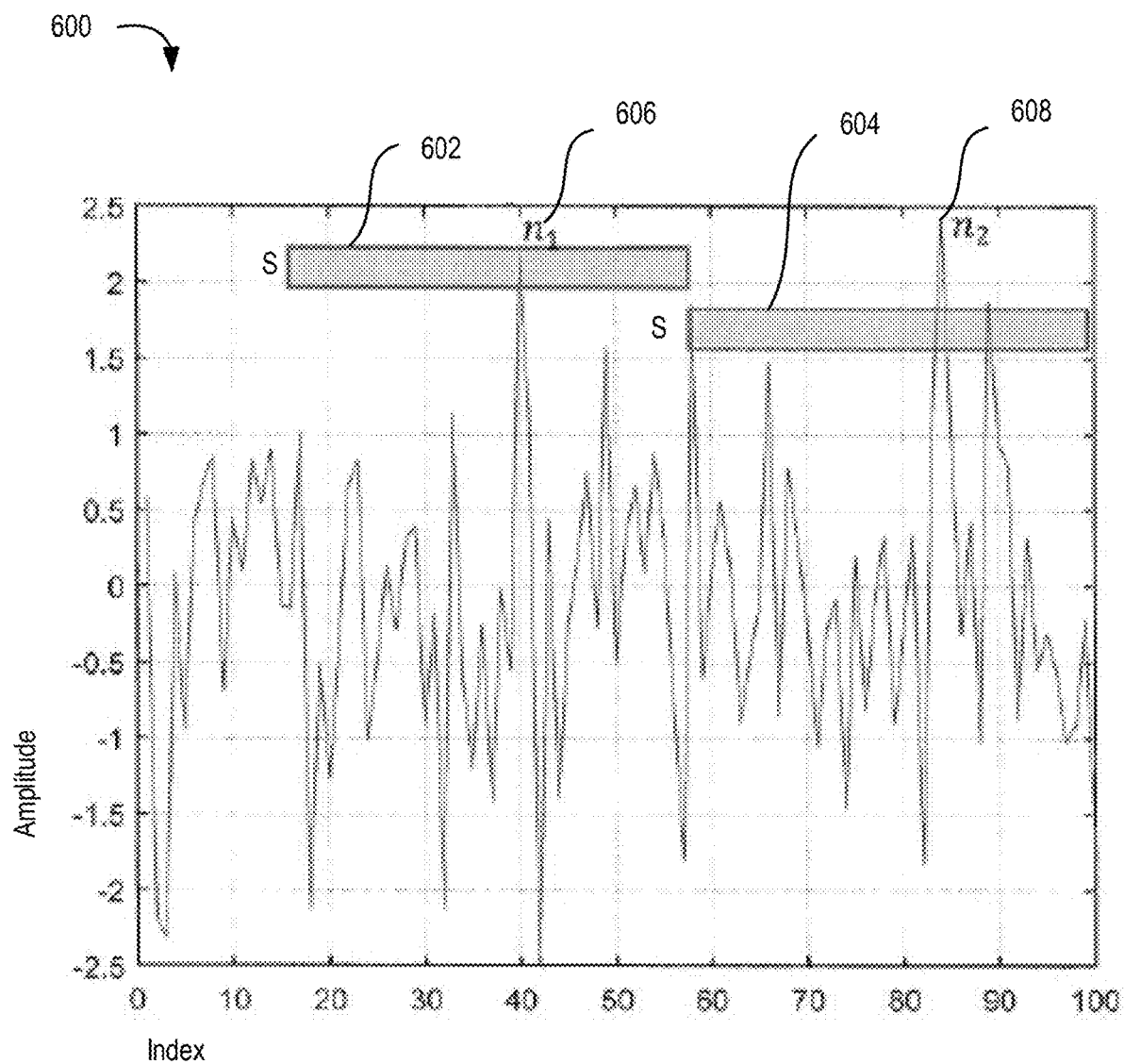
FIG. 6 is an example graph of the amplitude of a number of samples over two peak detect windows according to an example.

For a set of data samples, a PDW is defined as a subset of samples of the set of data samples. The typical peak detection find peaks and selects a highest peak in the PDW, thus qualifying only one peak over each PDW. Instead of scanning the data and selecting a peak over the PDW, the block max is selected over the PDW. For large block sizes, the max is almost always a peak. FIG. 6 shows an example graph 600 showing block max detection over two peak detect windows. FIG. 6 illustrates two PDWs 602 and 604. For a block of data (i.e., a PDW 602, 604) with S samples having indices $x0 \ldots x_{s-1}$, the max may fall on the block boundary $x_0$ or $x_{s-1}$.

The index of the peak $n_1$ can be recorded for the block max 606 of the PDW 602 can be recorded. The block max 608 of the immediate next PDW 604 can be found and the index of the peak $n_2$ is recorded. The peak $n_1$ is qualified as a peak only when the number of samples between the peaks is larger than the size S of the PDW, according to the following:

$$n_2 - n_1 > S$$

This ensures that the peaks are sufficiently separated in time. This also eliminates any peaks that falls at the boundary—because number of samples until the block max in the immediately following PDW could not be larger than the size of the PDW.

The block max for the PDW can be found using vector operations. The block max vector operation VMAX( ) performs element-wise or lane-wise (nth lane corresponds to the nth vector) max on for a set of N samples. The block vector operations performs lane-wise max on the vectors x and y and returns the vector z, with the max values chosen from the lanes of x or y, according to:

$$z = VMAX(x, y),$$

where $z(n) = x(n)$ if $x(n) > y(n)$ and $z(n) = y(n)$ if $x(n) < y(n)$, for $0 \le n \le N-1$, and where x, y, z are power vectors. The max is unique over a block of data.

Figure 7:
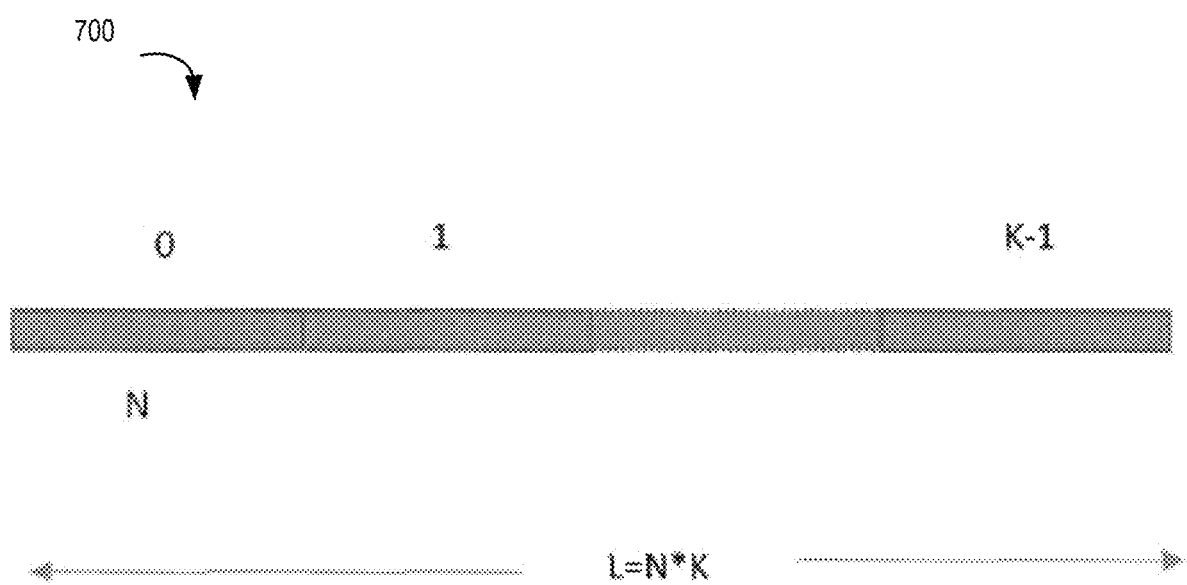
FIG. 7 is an example larger size peak detect window according to an example.

The block max operation describe above for the set of samples (i.e., a vector) of length N, can be extended to a larger size block of data. The PDW can be defined (e.g., constrained) to be a number of samples (or amount of time) that is an integer multiple of N. For example, the PDW can be defined to be of length $L = N*K$, where K is a positive integer, as shown in FIG. 7. z is initialized, for example, to zero elements. The VMAX operation is performed for the $i^{th}$ buffer $x_i$ according to:

$$z = VMAX(x_i, z),$$

for $0 \le i \le K$. Thus, the block max operation is performed iteratively K times for the larger block of L samples. After processing K buffers, i.e., repeating the block max operation K times over the L samples of the PDW, the vector z contains the max value over the larger PDW. The buffer containing the max value is referred to as the survivor buffer $z_s$. The max value $max(z_s)$ can be computed using scalar operations or element-wise check. For example, $max(z_s) = [V, m]$, where V is the max power value over the samples, and where m is the index of V in the survivor buffer $z_s$ (referred to as the fractional index) and $0 \le m \le N$. Boolean results of the VMAX operation can stored in a register.

Index tracking is done to find the location (i.e., the index of the peak) and the complex data sample corresponding to the peak. The index m of the max can be found using vector peak detection. Assuming that the max over the PDW is in a $q^{th}$ buffer $x_q$, the complete index of the max over the PDW (referred to as the running index) can be given as:

$$p = q \times N + m, \qquad \text{Eq. 1}$$

Another vector operation VSEL( ) can be used that returns the winning lane c on the set of N samples:

$$c = VSEL(x, y),$$

where $c(n) = 0$ if $x(n) > y(n)$ and $c(n) = 1$ if $x(n) < y(n)$, for $0 \le n \le N-1$. Thus, the VSEL operation performs a binary comparison to determine the lane-wise max on the vectors x and y. The buffer q can then be found by processing c using index finding as described further below.

Figure 8:
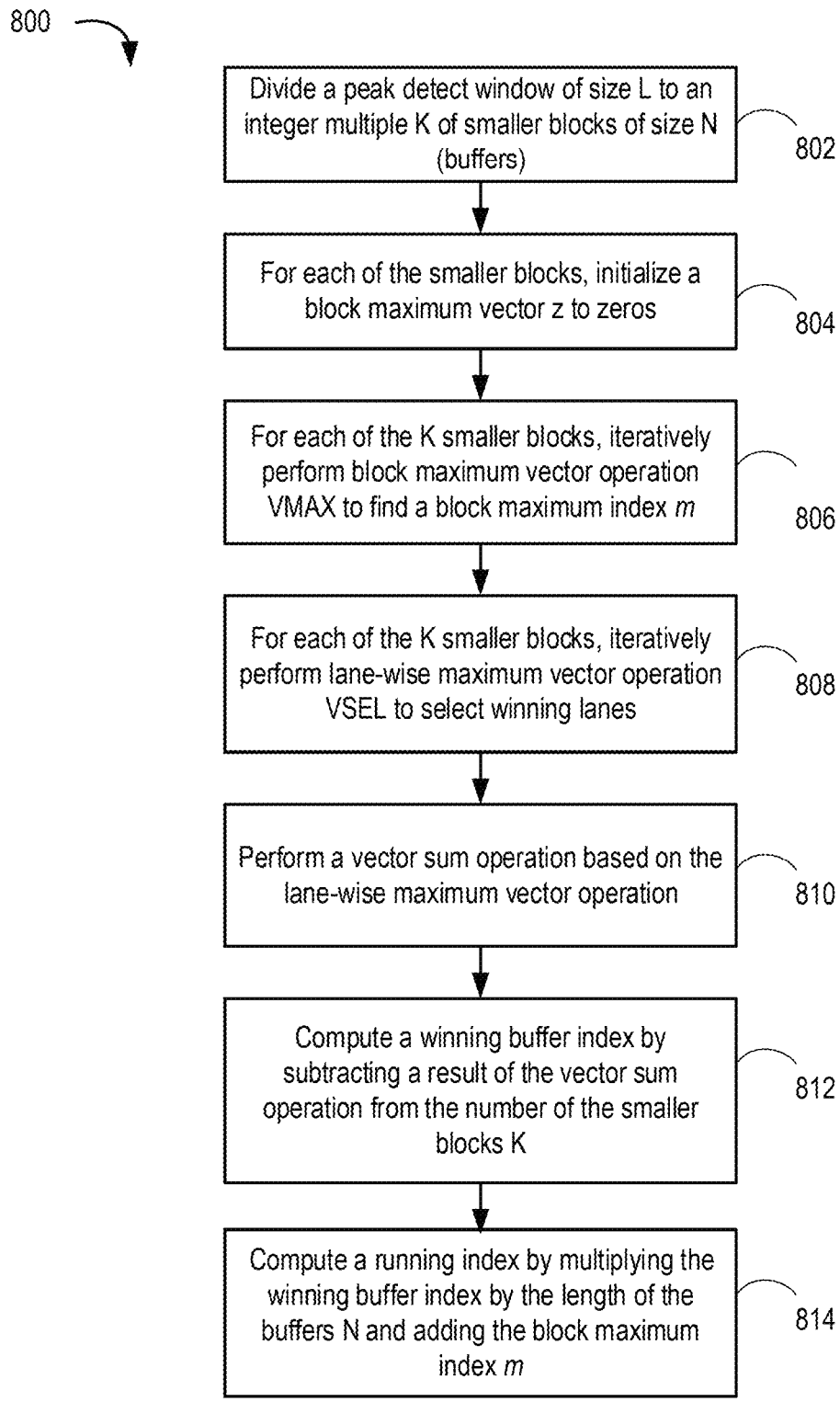
FIG. 8 is a flow diagram illustrating example operation for vectorized peak detection according to an example

In some examples, a technique for vectorized peak detection can combine the VMAX and VSEL operations. FIG. 8 is a flow diagram illustrating example operations 800 for vectorized peak detection according to an example.

At operation 802, a peak detect window of size L is divided into an integer multiple K of smaller blocks of size N (e.g., buffers). As described above, the length L of the PDW can be defined as a multiple K of N.

At operation 804, a block maximum vector is initialized to zero. For example, the buffer z can be initialized to zero elements as described above.

At operation 806, for each of the smaller block of size N, the block maximum vector operation VMAX is iteratively performed to find the block maximum index m. At operation 808, for each of the smaller block of size N, the lane-wise maximum vector operation VSEL is iteratively performed to select winning lanes. For example, as described above, for the $i^{th}$ data buffer $x_i$, the VMAX and VSEL vector operations can performed iteratively K times as follows:

$$c_i=\text{VSEL}(x_i,z)$$

$$z=V\text{MAX}(x_i,z),$$

for $0 \leq i \leq K$, where $x_i$ is the $i^{th}$ data buffer and $c_i$ contains the winning lanes for $x_i$. After processing the K buffers, the vector z contains the max value over the PDW in the survivor buffer $z_s$. The max value in the survivor buffer $\max(z_s)$ is computed using scalar operations or element-wise check to obtain the index of the max value [V,m], m is the winning lane for $0 \leq m \leq N$. After the $q^{th}$ data buffer, containing the max value, is processed the $m^{th}$ element in the winning lane $c_q$ is set to 1 by the VSEL operation, i.e., $c_q(m)=1$. Hence, the $m^{th}$ element in the subsequent lanes $c_i(m)$ for $i \geq q$ are also set to 1. This observation can be exploited using vector operations for the computation of the running index p.

At operation 810, a vector sum operation is performed based on the lane-wise maximum vector operation. Yet another vector operation can be performed according to:

$$R_i=R_{i-1} \oplus c_i, \text{ for } 0 \leq i \leq K,$$

where $R_i(j)=0$ (e.g., reset the register) if $c_j(j)=0$ and $R_i(j) =R_{i-1}(j)+1$ (e.g., accumulate) if $c_j(j)=1$, for $0 \leq j \leq N$.

At operation 812, a winning buffer index is computed by subtracting a result of the vector sum operation from the number of the smaller block K. The winning buffer index q can be computed according to:

$$q=K-R_{K-1}(m) \qquad \text{Eq. 2}$$

At operation 814, the running index is computed by multiplying the winning buffer index by the length of the buffers N and adding the block maximum index m. Substituting equation 2 for q into the equation 1, the running index p can then be computed according to:

$$p=(K-R_{K-1}(m)) \times N + m$$

Figure 9:
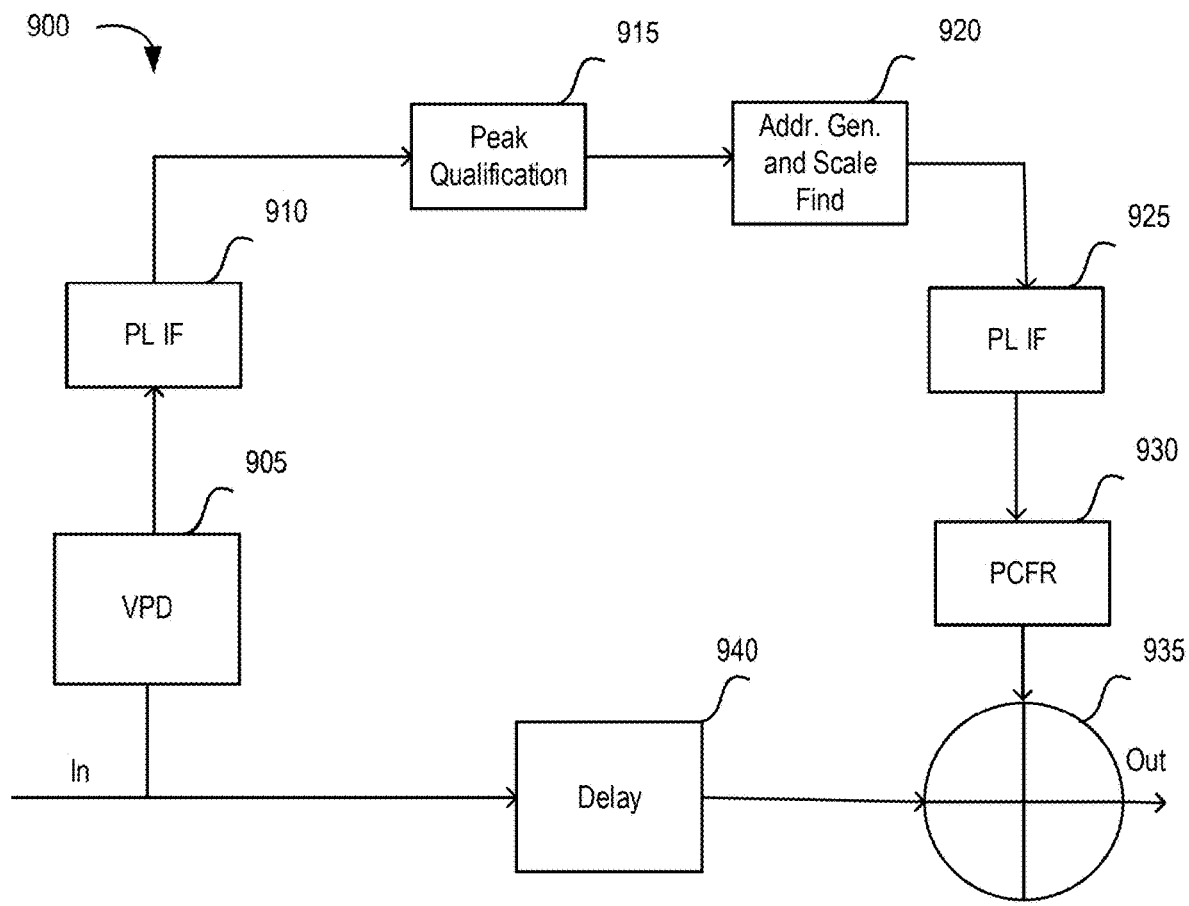
FIG. 9 is a block diagram illustrating programmable logic elements for a CFR operation according to an example.

FIG. 9 is a block diagram illustrating programmable logic elements 900 for a CFR operation according to an example. FIG. 9 represents a portion of programmable logic elements of a processing subsystem. As shown in FIG. 9, the PL elements 900 include a vectorized peak detection (VPD) block 905, an IF block 910, a peak qualification block 915, address generation and scale find block 920, IF block 925, PCFR block 930, summing operation block 935, and delay block 940. The VPD block 905 may be configured to perform the operations 800.

Figure 10:
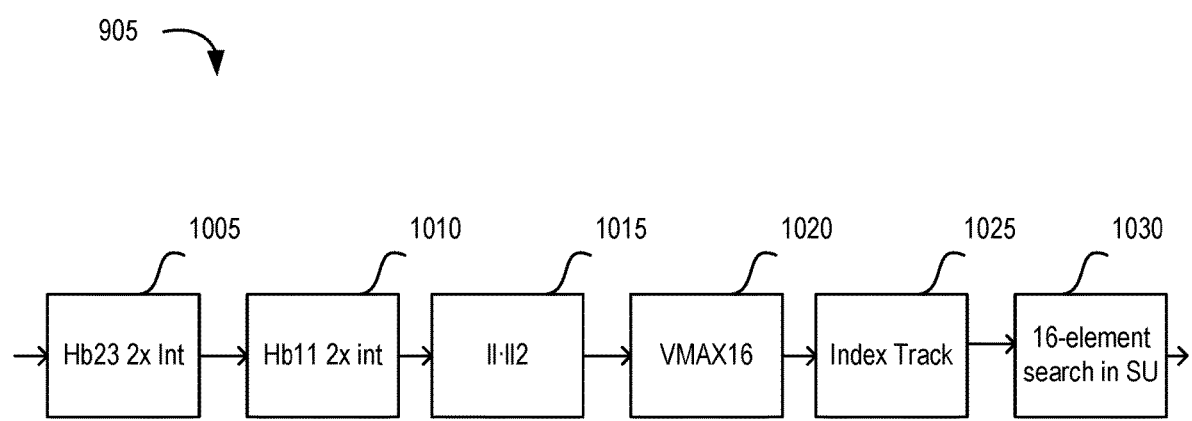
FIG. 10 is a block diagram illustrating example programmable logic elements for a vectorized peak detection block of the CFR operation according to an example.

FIG. 10 is a block diagram illustrating example programmable logic elements for the VPD 905 block of the CFR operation according to an example. As shown in FIG. 10, the VPD 905 can include a Hb23 2x Int block 1005, Hb11 2x Int block 1010, a operation block 1015, VMAX16 block 1020, Index Track block 1025, and 16-element search in SU block 1030. The block 1005 and 1010 can perform data interpolation. The operation block 1015 can perform the VMAX operation to perform binary amplitude comparisons. VMAX 16 can perform the VSEL operation described above to find a lane-wise max and output the vector with the lane-wise winners with the location of which smaller block the PDW contains the maximum. The Boolean lane-wise winners can be stored in a register. The index tracking block 1025 can perform the vector sum operation to compute the winning lane index and the running index. The vector sum operation can accumulate the binary values in a vector register. The element search in SU block 1030 can search the fractional index of the maximum magnitude m, reconstruct the maximum index p, and extract the corresponding sample from the data stream.

While the foregoing is directed to specific examples, other and further examples may be devised without departing from the basic scope thereof, and the scope thereof is determined by the claims that follow.

What is claimed is:

1. A method for signal processing in an integrated circuit (IC) having a data processing engine, comprising:
   dividing a set of data samples of a data signal, corresponding to a peak detection window (PDW), into a plurality of subsets of data samples each comprising a number of data samples;
   performing vector operations in the data processing engine on each of the plurality of subsets of data samples; and
   determining a first running index of a first sample with a maximum amplitude over the PDW based on the vector operations, the first running index determined by: multiplying an index of a subset of the plurality of subsets by a number of data samples in each of the plurality of subsets to generate a product, and adding a fractional index to the product.

2. The method of claim 1, wherein performing the vector operations comprises:
   performing a first vector operation to determine, within each of the plurality of subsets, a sample with a maximum amplitude;
   performing a second vector operation to determine a binary value for each sample of the plurality of subsets; and
   performing a third vector operation to determine an accumulated value based on the binary values determined in the second vector operation.

3. The method of claim 2, wherein determining the first running index comprises:
   determining the fractional index of the first sample with the maximum amplitude over the PDW based on the determined samples within each of the plurality of subsets;
   determining the index of a subset of the plurality of subsets that contains the first sample with the maximum amplitude over the PDW by subtracting the accumulated value from a number of the plurality of subsets.

4. The method of claim 2, wherein the first vector operation is a lane-wise operation that compares a first power vector in the subset and a second power vector for a sample in the subset and outputs the larger of the first or second power vector, for each sample in the subset.

5. The method of claim 2, wherein the second vector operation is a lane-wise operation that compares a sample in a first subset and a corresponding sample in a second subset, over each of the plurality of subsets, and outputs a 0 if the sample in the first subset is larger than the corresponding sample second subset and a 1 if the sample in the first subset is smaller than the corresponding sample in the second subset.

6. The method of claim 5, further comprising: if a 1 is output for a sample in subset, outputting a 1 for the corresponding sample in each of the subsequent subsets.

7. The method of claim 2, wherein determining the fractional index comprises a scalar operation.

8. The method of claim 5, wherein the third operation comprises:
   initializing the accumulated value to zero; and
   for each sample in the PDW:
      resetting the accumulated value to zero if the output for the sample in the subset is zero; and
      incrementing the accumulated value by 1 if the output for the sample in the subset is one.

9. The method of claim 1, further comprising:
   determining a second running index for a second sample with a maximum amplitude over a second PDW;
   comparing the first running index and the second running index; and
   qualifying the first sample with the maximum amplitude over the first PDW as a peak if the difference between the first running index and the second running index is larger than the number of samples in the PDW.

10. The method of claim 9, further comprising:
    removing the peak from the signal.

11. A data processing engine (DPE), comprising:
    a register file;
    a processor, coupled to the register file, configured to:
       divide a set of data samples of a data signal, corresponding to a peak detection window (PDW), into a plurality of subsets of data samples each comprising a number of data samples;
       perform vector operations on each of the plurality of subsets of data samples; and
       determine a first running index of a first sample with a maximum amplitude over the PDW based on the vector operations, the first running index determined by: multiplying an index of a subset of the plurality of subsets by a number of data samples in each of the plurality of subsets to generate a product, and adding a fractional index to the product.

12. The DPE of claim 11, wherein the processor is configured to:
    perform a first vector operation to determine, within each of the plurality of subsets, a sample with a maximum amplitude;
    perform a second vector operation to determine a binary value for each sample of the plurality of subsets; and
    perform a third vector operation to determine an accumulated value based on the binary values determined in the second vector operation.

13. The DPE of claim 12, wherein the processor is configured to determine the first running index by:
    determining the fractional index of the first sample with the maximum amplitude over the PDW based on the determined samples within each of the plurality of subsets;
    determining the index of a subset of the plurality of subsets that contains the sample with the maximum amplitude over the PDW by subtracting the accumulated value from a number of the plurality of subsets.

14. The DPE of claim 12, wherein the first vector operation is a lane-wise operation and the processor is configured to perform the first vector operation by:
    comparing a first power vector in the subset and a second power vector for a sample in the subset, and
    output the larger of the first or second power vector, for each sample in the subset.

15. The DPE of claim 12, wherein the second vector operation is a lane-wise operation and the processor is configured to perform the second vector operation by:
    comparing a sample in a first subset and a corresponding sample in a second subset, over each of the plurality of subsets, and
    output a 0 if the sample in the first subset is larger than the corresponding sample second subset and a 1 if the sample in the first subset is smaller than the corresponding sample in the second subset.

16. The DPE of claim 15, wherein the processor is further configured to:
    if a 1 is output for a sample in subset, output a 1 for the corresponding sample in each of the subsequent subsets.

17. The DPE of claim 15, wherein the processor is configured to perform the third operation by:
    initializing the accumulated value to zero; and
    for each sample in the PDW:
       resetting the accumulated value to zero if the output for the sample in the subset is zero; and
       incrementing the accumulated value by 1 if the output for the sample in the subset is one.

18. The DPE of claim 11, wherein the processor is further configured to:
    determine a second running index for a second sample with a maximum amplitude over a second PDW;
    compare the first running index and the second running index; and
    qualify the first sample with the maximum amplitude over the first PDW as a peak if the difference between the first running index and the second running index is larger than the number of samples in the PDW.

* * * * *